March 27, 1973 W. SCHMIEDECKE 3,723,277
METHOD FOR THE PRODUCTION OF MASKS IN THE MANUFACTURE OF
SEMICONDUCTOR COMPONENTS
Filed July 14, 1971

INVENTOR
WERNER SCHMIEDECKE

BY

Nolte & Nolte
ATTORNEYS

United States Patent Office 3,723,277
Patented Mar. 27, 1973

3,723,277

METHOD FOR THE PRODUCTION OF MASKS IN THE MANUFACTURE OF SEMICONDUCTOR COMPONENTS

Werner Schmiedecke, Dresden, Germany, assignor to Arbeitsstelle fur Molekularelektronik, Dresden, Germany Continuation-in-part of abandoned application Ser. No. 794,663, Jan. 28, 1969. This application July 14, 1971, Ser. No. 163,546
Int. Cl. C23c *15/00*
U.S. Cl. 204—192 9 Claims

ABSTRACT OF THE DISCLOSURE

In a process for the production of masks in the manufacture of semiconductor components, onto a coated or uncoated semiconductor substrate is sputtered a composition containing a silicon oxide or nitride compound at a power density no greater than about 0.2 watt per $cm.^2$ until a coating thickness of at least 0.1 $\mu$m. is attained and then at a power density no greater than about 0.4 watt per $cm.^2$ until the coating has attained a thickness of 0.3 to 2.0 $\mu$m., then the power density is increased to 3 to 5 watts per $cm.^2$ to partially decompose the photoresist mask and tear open the coating superimposed thereon; this is followed by solvent and ultrasonic treatments to remove the remaining photoresist and superimposed coating.

This is a continuation-in-part of application Ser. No. 794,663, filed Jan. 28, 1969, now abandoned.

It is known to mask semiconductor components to a varying degree during their manufacturing process. In order to produce contacts, conduction paths or additional conduction path planes or areas of different conductivity in the semiconductor components by diffusion, the surface areas of the semiconductor components which are not to be changed must be provided with a suitable mask.

Such a mask is produced as follows: A continuous silicon oxide-coating of several tenths of a $\mu$m. to 2 $\mu$m. in thickness is produced by thermal oxidation, or sometimes by pyrolysis, evaporation or sputtering, on the semiconductor body, as, for example, a silicon-disc. By means of photographic methods, a photoresist mask is then applied, which because of its sufficient resistance to the usual silicon oxide-etching media permits the etching of holes into the silicon oxide-coating at the desired points. In the same manner, one may produce the mask openings after one or several diffusion steps, except that in this case there results a silicate-coating instead of a silicon oxide coating.

Due to the nature of the etching processes, the etched holes in the silicon oxide-coat are always greater than the openings of the photoresist masks, in that the etching medium penetrates not only in depth but also in a lateral direction. To these normal underetchings there are added frequently greater underetchings when a fine crack appears at any point between the photoresist mask and the silicon oxide-coat into which the etching medium can penetrate. The effects of both types of underetchings are further increased by the fact that a safety margin must be added to the etching time in continuous production so that the etching medium actually penetrates in all points.

The above described phenomena prevent the full utilization of the mask and adjusting accuracy, and cause a certain waste quota. This poses an increasing problem in view of the increasing miniaturization of semiconductor technology, particularly in the semiconductor block technique. Difficulties are also encountered in the etching technique when silicon nitride-containing masking coats are used. These are etched at a much slower rate than the silicon oxide-coatings, so that the photoresist mask is considerably attacked during the etching process.

The object of the present invention is to avoid to a great extent the disadvantages connected with the present state of technology as explained above, and to permit the masking of semiconductor components by means which can be firmly controlled by conventional techniques.

The invention is directed to the problem of providing a method that permits the masking of semiconductor components without the necessity of microstructure etchings.

This problem is solved according to the invention by producing, in known manner, a photoresist mask on the surface of a semiconductor substrate or on a layer already covering the substrate obtained from preceding process steps, by applying a silicon oxide-coating, by cathodic sputtering in a gas discharge, both on the photoresist mask and on photoresist-free areas. Any conventional photoresist mask material may be employed, e.g., polyvinyl alcohol phenyl acrylic acid ester, diazochinone resins, partially cyclicized cis-polyisoprene and the like. The photoresist mask is partly decomposed by controlling the discharge at the desired thickness of the silicon oxide-coat, the superimposed silicon oxide-coat is simultaneously torn open, thus producing openings in the previously hermetically tight silicon oxide coat. Only by these openings a solvent can act on the photoresist mask in the subsequent treatment, namely, after the discharge has been stopped, the substrate is treated with a solvent capable of dissolving the photoresist mask, as, for example, trichlorethylene. The undecomposed parts of the photoresist mask swell, while the superimposed parts of the silicon oxide-coating tear off at the edges and are removed after ultrasonic treatment, together with the remainder of the photoresist mask.

The remaining silicon oxide-coat as a finished mask is the exact negative of the previous photoresist mask without impairment of the oxide borders as in the under-etchings. This, namely the elimination of the underetchings with their resulting disadvantages, represents the essential advantage of the process of the invention.

A variation of the invention consists in applying, instead of silicon oxide, a compound of the type $SiO_x$, wherein $1 \leq X \leq 2$.

In still another variation of the invention, silicon oxide can be replaced by silicon nitride or by silicon nitride-containing coats.

The invention will now be described in connection with the production of diffusion masks, and by reference to the accompanying drawings, wherein.

Figure 1:
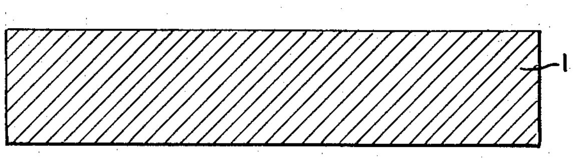
FIG. 1 is a cross-section of a semiconductor substrate.
Figure 2:
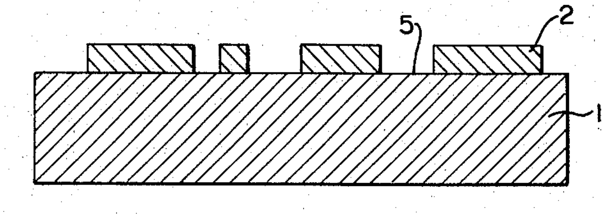
FIG. 2 is a cross-section of the substrate provided with a photoresist mask.
Figure 3:
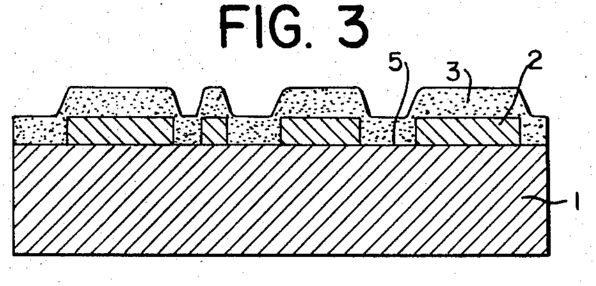
FIG. 3 is a cross-section of the substrate with a photoresist mask and a sputtered-on silicon oxide-coat.
Figure 4:
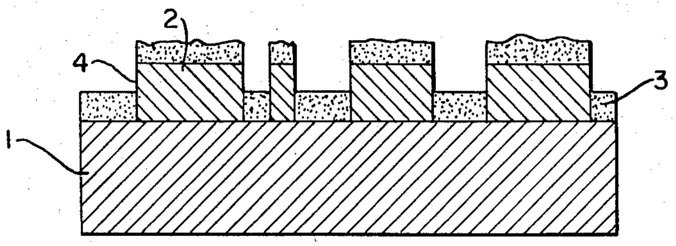
FIG. 4 is a cross-section of the substrate with a swelling photoresist mask and the silicon oxide-coat torn open.

For purposes of illustration, the thin coats, that is, the photoresist mask and the silicon oxide-coat, are not represented in correct scale within the drawings.

A substrate 1 to be masked, as, for example, a polished silicon-disc, is cleaned in known manner by means of high-purity solvents, and, subsequently, provided under clean-room conditions also in known manner, with a polyvinyl alcohol phenylacrylic acid ester mask 2, which carries the finished product. In addition to the usual requirements of absence of pores and good resolution of the border, the photoresist mask 2 should desirably be provided with steep borders, and not be too sensitive to ion and electron bombardment. Both positive and negative photoresist can be used for the purpose. It is found, however, that hardening or tempering of the photoresist mask after the development is not advisable, because it reduces the swelling capacity of the photoresist.

According to the method of the invention, a silicon oxide-coat 3 is applied by cathodic sputtering both on the photoresist mask 2 and on the photoresist-free areas 5 of the substrate 1. This process is effected in known manner by either a high-frequency or a DC voltage-cathodic sputtering technique.

The nature of the process when using HF-cathodic sputtering will now be described. The power densities indicated refer to an arrangement where the magnetic induction in the discharge region is between 10 and 100 gausses. The magnetic field produced by an outer coil can be positioned either parallel to the electric field or perpendicularly thereto.

The preferred target material to be used is a quartz disc of high-purity. The heatable and coolable substrate base is arranged at a distance of from 2 to 5 cm. from the target. After charging the substrate base with the photoresist-masked substrates 1, a high vacuum is produced, initially, until the residual gas pressure has attained the value necessary for the intended purpose, namely, a value within the range of from $1.10^{-5}$ to $1.10^{-7}$ torr. By introducing a high-purity working gas, as, for example, Ar or $O_2$ or $N_2$, or any mixtures thereof, and, if necessary, throttling the diffusion pump, the necessary working pressure is produced in the apparatus and is found to be between $2.10^{-4}$ and $1.10^{-2}$ torr. The silicon oxide-coat 3 is applied by sputtering after starting the gas discharge. The HF power density should not exceed approximately 0.2 watt per cm.$^2$ in order that the photoresist mask 2 not be destroyed. The figure 0.2 watt per cm.$^2$ is approximate because for some photoresist masks other than polyvinyl alcohol phenylacrylic acid esters it will be slightly higher or lower. When the thickness of the silicon oxide-coat has attained a value of 0.1 $\mu$m., the HF power density can be increased to approximately 0.4 watt per cm.$^2$ to accelerate the sputtering process.

After the desired thickness of the silicon oxide-coat 3 has been attained, namely 0.3 to 2.0 $\mu$m., which is checked by an optical coat-thickness measuring instrument during the sputtering, the HF power density is increased to a value of 3 to 5 watts per cm.$^2$. The substrates 1 are thus bombarded heavily from the gas discharge with electrons and ions, and, in addition, the energy radiated from the plasma increases considerably. The result is that the photoresist mask 2 begins to decompose with evolution of gas, and the superimposed silicon oxide-coat breaks open thus producing openings in the previously hermetically tight silicon oxide coat. In order to avoid a more than superficial destruction of the photoresist mask 2, the increase of power is effected within a short time, approximately 10 to 30 seconds. Then the discharge is immediately stopped.

As has already been pointed out, the indicated power densities apply under the existence of a certain magnetic induction range in the discharge region. In addition, they also depend on qualitative factors of the photoresist mask 2, and must be determined for the individual working phases for each type of photoresist and for the other conditions in special preliminary tests. The sputtering takes place in substantially the same manner if the quartz target is replaced by a silicon-target in order to sputter a compound of the type $SiO_x$ (wherein $1 \leq X \leq 2$), or $Si_3N_4$, or a mixture of both.

After the cathodic sputtering, the substrates 1 are removed from the vacuum apparatus and placed in a solvent suitable for the photoresist, for example, trichloroethylene. The penetration of the solvent through the openings produced during the high power density phase is accelerated if an ultrasonic treatment of about 10 to 30 seconds is effected from the start.

Figure 5:
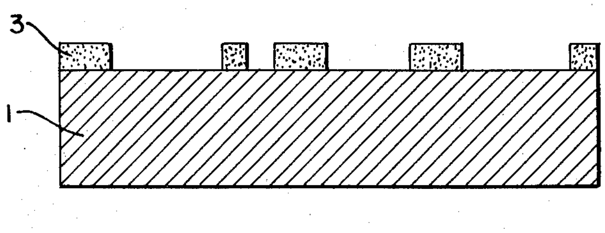
FIG. 5 is a cross-section of the substrate with a finished silicon oxide-diffusion mask.

After the photoresist mask 2 is sufficiently swollen, a condition which is attained in about 5 to 30 minutes, it is subjected to an additional ultrasonic-treatment for about 1 to 3 minutes. Then the residues of the photoresist mask 2 and the superimposed silicon oxide-coat can be easily wiped off. Subsequent rinsing in low-dust, high-purity solvents, and blowing-off completes the treatment. FIG. 5 shows the finished silicon oxide-mask.

If after a diffusion following the masking, which, as known, produces a closed oxide-silicate coat on the silicon-substrate, an additional mask is to be produced according to the above described method, as, for example, for a second diffusion or contacting, the oxide-silicate coat must naturally be removed by etching completely in known manner, before the new mask can be applied.

Although the foregoing description proceeds by way of example from a Si-substrate, the invention can also be used in conjunction with other semiconductor materials, as, for example, germanium or $A_{III}B_V$ compounds instead of silicon. It follows that such a variation does not represent a deviation from the basic principles underlying the process of the invention. Nor is the invention limited to the production of diffusion masks, in that, it may be used with equivalent results for the production of masks which serve to apply conduction paths and additional conduction path planes.

What is claimed is:

1. Process for the production of masks for use in the manufacture of semiconductor components wherein a patterned masking coat is applied to the surface of a semiconductor substrate or on a layer already covering the substrate as obtained by preceding process steps that comprises, applying a coating material selected from the group consisting of silica, silicon nitride, silicon nitride containing materials and compounds represented by the formula $SiO_x$, wherein $1 \leq X \leq 2$, to photoresist-masked and unmasked areas of a semiconductor substrate by cathodic sputtering in a gas discharge, the sputtering initially being carried out at a power density not greater than about 0.2 watt per cm.$^2$ until the coating has attained a thickness of at least 0.1 $\mu$m. and then being carried out at a power density not greater than about 0.4 watt per cm.$^2$ until the coating has attained a thickness of 0.3 to 2.0 $\mu$m., increasing the power density to 3 to 5 watts per cm.$^2$ to effect partial decomposition of said photoresist mask and tearing open of superimposed previously hermetically tight coating material applied therein, stopping said discharge and treating said substrate with a solvent for said photoresist mask to effect swelling of undecomposed portions of said mask and tearing at the borders of superimposed portions of said coating material, and subjecting said substrate to ultrasonic treatment to effect removal of the residues of said photoresist mask and said superimposed portions of coating material.

2. A process according to claim 1 further comprising subjecting said substrate to the action of ultrasonic treatment at the beginning of the treatment with said solvent.

3. A process according to claim 1, wherein said coating material is $SiO_2$.

4. A process according to claim 1, wherein said coating material is silicon nitride.

5. A process according to claim 1, wherein said coating material is a compound selected from the group representing by the formula $SiO_x$, wherein $1 \leq X \leq 2$.

6. A process according to claim 1, in which the increasing in the power density is effected in approximately 10 to 30 seconds and then the discharge is immediately stopped.

7. A process according to claim 1, in which the substrate is maintained under vacuum at a pressure of $2.10^{-4}$ to $1.10^{-2}$ torr.

8. A process according to claim 2, in which the ultrasonic treatment at the beginning of the solvent treatment is for a period of 10 to 30 seconds.

9. A process according to claim 8, in which after about 5 to 30 minutes of the solvent treatment the substrate is subjected to an additional ultrasonic treatment for about 1 to 3 minutes.

References Cited

UNITED STATES PATENTS

| | | | |
|---|---|---|---|
| 3,507,766 | 4/1970 | Cunningham et al. | 204—192 |
| 3,436,327 | 4/1969 | Shockley | 204—192 |
| 3,220,903 | 11/1965 | Madansky | 204—192 |
| 3,432,417 | 3/1969 | Davidse et al. | 204—192 |
| 2,999,034 | 9/1961 | Heidenham | 117—5.5 |
| 2,728,693 | 12/1955 | Cado | 96—32.2 |

JOHN H. MACK, Primary Examiner

S. S. KANTER, Assistant Examiner